(12) United States Patent
Xian et al.

(10) Patent No.: US 10,481,444 B2
(45) Date of Patent: Nov. 19, 2019

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Jianbo Xian, Beijing (CN); Hongfei Cheng, Beijing (CN); Yong Qiao, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/565,775

(22) PCT Filed: May 12, 2017

(86) PCT No.: PCT/CN2017/084039
§ 371 (c)(1),
(2) Date: Oct. 11, 2017

(87) PCT Pub. No.: WO2017/206697
PCT Pub. Date: Dec. 7, 2017

(65) Prior Publication Data
US 2019/0121207 A1  Apr. 25, 2019

(30) Foreign Application Priority Data
Jun. 1, 2016 (CN) .................... 2016 2 0525942 U (51) Int. Cl.
*G02F 1/1343* (2006.01)
*G02F 1/1362* (2006.01)
*H01L 27/12* (2006.01)

(52) U.S. Cl.
CPC ...... *G02F 1/134363* (2013.01); *G02F 1/1343* (2013.01); *G02F 1/136286* (2013.01);
(Continued)

(58) Field of Classification Search
CPC combination set(s) only.
See application file for complete search history.

(56) References Cited

U.S. PATENT DOCUMENTS

2014/0054703 A1* 2/2014 Feng ................. G02F 1/134363
257/347
2015/0185902 A1* 7/2015 Liu ......................... G06F 3/044
345/174

(Continued)

FOREIGN PATENT DOCUMENTS

CN 102466933 A 5/2012
CN 102830560 A 12/2012
(Continued)

OTHER PUBLICATIONS

International Search Report and Written Opinion for Application No. PCT/CN2017/084039, dated Jul. 28, 2017, 10 Pages.

*Primary Examiner* — Mamadou L Diallo
(74) *Attorney, Agent, or Firm* — Brooks Kushman P.C.

(57) ABSTRACT

The present disclosure provides an array substrate, a display panel and a display device. The array substrate includes a display region and a non-display region surrounding the display region. The array substrate further includes a plurality of gate lines, a plurality of data lines, and a plurality of common electrode lines. The plurality of data lines and the plurality of gate lines define a plurality of pixel units at the display region, and each pixel unit includes a pixel electrode. At least one of the plurality of common electrode lines includes a main line and a branch line located at at least one side of the main line, and at least a part of the branch lines are located at an inner side of a periphery of the display region.

20 Claims, 6 Drawing Sheets

(52) U.S. Cl.
CPC ........ *H01L 27/124* (2013.01); *G02F 1/13439* (2013.01); *G02F 1/136209* (2013.01); *G02F 2201/121* (2013.01)

(56) References Cited

U.S. PATENT DOCUMENTS

| | | | |
|---|---|---|---|
| 2016/0291435 A1* | 10/2016 | Que | G02F 1/134363 |
| 2016/0320650 A1* | 11/2016 | Ding | G02F 1/13338 |
| 2017/0045792 A1 | 2/2017 | Cheng et al. | |

FOREIGN PATENT DOCUMENTS

| | | |
|---|---|---|
| CN | 202735644 U | 2/2013 |
| CN | 204462602 U | 7/2015 |
| CN | 205656411 U | 10/2016 |
| KR | 20030094752 A | 12/2003 |

* cited by examiner

ARRAY SUBSTRATE, DISPLAY PANEL AND DISPLAY DEVICE

CROSS-REFERENCE TO RELATED APPLICATION APPLICATIONS

This application is the U.S. national phase of PCT Application No. PCT/CN2017/084039 filed on May 12, 2017, which claims priority to Chinese Patent Application No. 201620525942.6 filed on Jun. 1, 2016, which are incorporated herein by reference in their entireties.

TECHNICAL FIELD

The present disclosure relates to the field of display technology, in particular to an array substrate, a display panel and a display device.

BACKGROUND

Currently, liquid crystal display technology, as the most widely used display technology, has been applied to televisions, mobile phones and public information displays. For a conventional liquid crystal display device, liquid crystal molecules at a periphery of a display region cannot be deflected easily, and thereby a display angle and a display effect of the liquid crystal display device may be adversely affected.

SUMMARY

The present disclosure provides in some embodiments an array substrate, a display panel and a display device, so as to solve the problem, to some extent, in the related art where the liquid crystal molecules at the periphery of the display region of the liquid crystal display device cannot be defected easily.

In one aspect, the present disclosure provides in some embodiments an array substrate, including a display region and a non-display region surrounding the display region. The array substrate further includes a plurality of gate lines, a plurality of data lines, and a plurality of common electrode lines. The plurality of data lines and the plurality of gate lines define a plurality of pixel units at the display region, and each pixel unit includes a pixel electrode. At least one of the plurality of common electrode lines includes a main line and a branch line located at at least one side of the main line, and at least a part of the branch lines are located at an inner side of a periphery of the display region.

In a possible embodiment of the present disclosure, a portion of the branch line is located at a region where one pixel unit is located, and an orthogonal projection of the branch line onto a plane where the array substrate is located overlaps an orthogonal projection of the pixel electrode of the corresponding pixel unit onto the plane where the array substrate is located.

In a possible embodiment of the present disclosure, a part of the branch lines are located at a region where a plurality of pixel units is located.

In a possible embodiment of the present disclosure, the branch lines are arranged at opposite sides of the main line.

In a possible embodiment of the present disclosure, each gate line extends in a row direction, two gate lines corresponding to the pixel units in two adjacent rows form a gate line group, each gate line group is arranged between the corresponding pixel units in two adjacent rows, each common electrode line is arranged between two adjacent rows of the pixel units, the gate line groups and the common electrode lines are arranged alternately, and the pixel units in one row are arranged between the gate line group and the common electrode line adjacent to the gate line group. The branch line includes a first branch line arranged at one side of the main line and a second branch line arranged at an opposite side of the main line and arranged parallel to, or in a line identical to, the first branch line.

In a possible embodiment of the present disclosure, the main line is arranged parallel to, and created from a layer identical to, the gate line.

In a possible embodiment of the present disclosure, the branch line is arranged parallel to the data line.

In a possible embodiment of the present disclosure, a length of the branch line is ⅗ to ⅚ of a length of the corresponding pixel unit in an extension direction of the data line.

In a possible embodiment of the present disclosure, a portion of the branch line is located between a first pixel unit and a second pixel unit adjacent to the first pixel unit, and an orthogonal projection of the branch line onto the plane where the array substrate is located overlaps an orthogonal projection of a pixel electrode of the first pixel unit and an orthogonal projection of a pixel electrode of the second pixel unit onto the plane where the array substrate is located.

In a possible embodiment of the present disclosure, the plurality of common electrode lines includes a first common electrode line and a second common electrode line arranged opposite to the first common electrode line, a width of each of the first common electrode line and the second common electrode line is greater than a width of each of the other common electrode lines, and the first common electrode line is located at a side of the display region adjacent to a region where a source driving chip is located.

In a possible embodiment of the present disclosure, the common electrode lines includes a plurality of first common electrode lines and a plurality of second common electrode lines, a width of the first common electrode line is greater than a width of the second common electrode line, and the first common electrode line and the second common electrode line are arranged alternately.

In a possible embodiment of the present disclosure, the common electrode lines are arranged symmetrically relative to a central axis of the array substrate.

In a possible embodiment of the present disclosure, at least parts of the common electrode lines are electrically connected to each other at the display region.

In a possible embodiment of the present disclosure, two adjacent common electrode lines are electrically connected to each other at the display region.

In another aspect, the present disclosure provides in some embodiments a display panel including the above-mentioned array substrate.

In yet another aspect, the present disclosure provides in some embodiments a display device including the above-mentioned display panel.

In still yet another aspect, the present disclosure provides in some embodiments an array substrate, including a display region and a non-display region surrounding the display region. The array substrate further includes a plurality of data lines extending in a column direction, a plurality of gate lines extending in a row direction, and a plurality of common electrode lines. The plurality of data lines and the plurality of gate lines define a plurality of pixel units at the display region, and each pixel unit includes a pixel electrode. At least one of the plurality of common electrode lines includes a main line extending in the row direction and a branch line extending in the column direction and located at at least one side of the main line and at an inner side of a periphery of the display region. A portion of the branch line is located at a region where at least one pixel unit is located, and an orthogonal projection of the branch line onto a plane where the array substrate is located overlaps an orthogonal projection of the pixel electrode of the corresponding pixel unit onto the plane where the array substrate is located. Two gate lines corresponding to the pixel units in two adjacent rows form a gate line group, each gate line group is arranged between the corresponding pixel units in two adjacent rows, each common electrode line is arranged between two adjacent rows of the pixel units, the gate line groups and the common electrode lines are arranged alternately, and the pixel units in one row are arranged between the gate line group and the common electrode line adjacent to the gate line group. The main line and the branch line of each common electrode line are created from a layer identical to the gate line.

According to the embodiments of the present disclosure, at least one of the common electrode lines is provided with the branch line, and at least a part of the branch lines are located at a periphery of the display region, so electric fields may be generated between the branch line as well as the main line and the corresponding pixel electrode in different orientations. As a result, it is able to deflect liquid crystal molecules at the inner side of the periphery of the display region, thereby to enlarge a display angle.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure.

Figure 1:
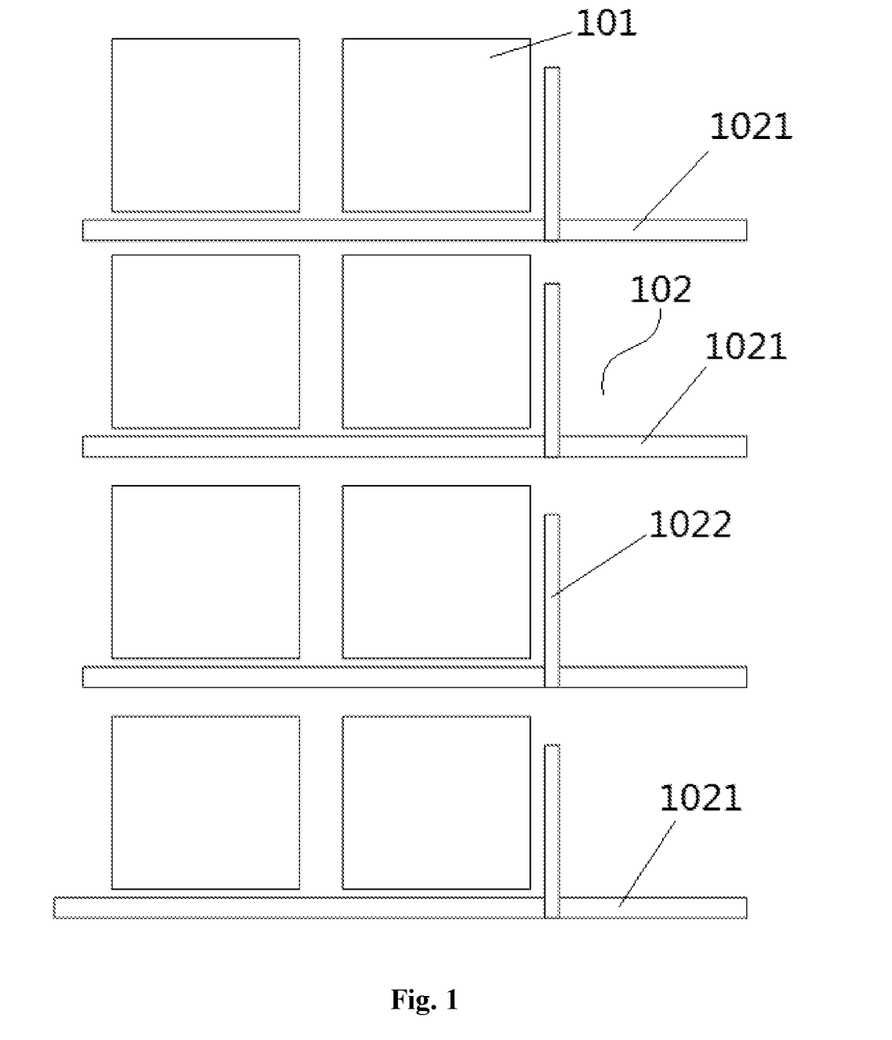
FIG. 1 is a schematic view showing the arrangement of lines on an array substrate according to one embodiment of the present disclosure.
Figure 6:
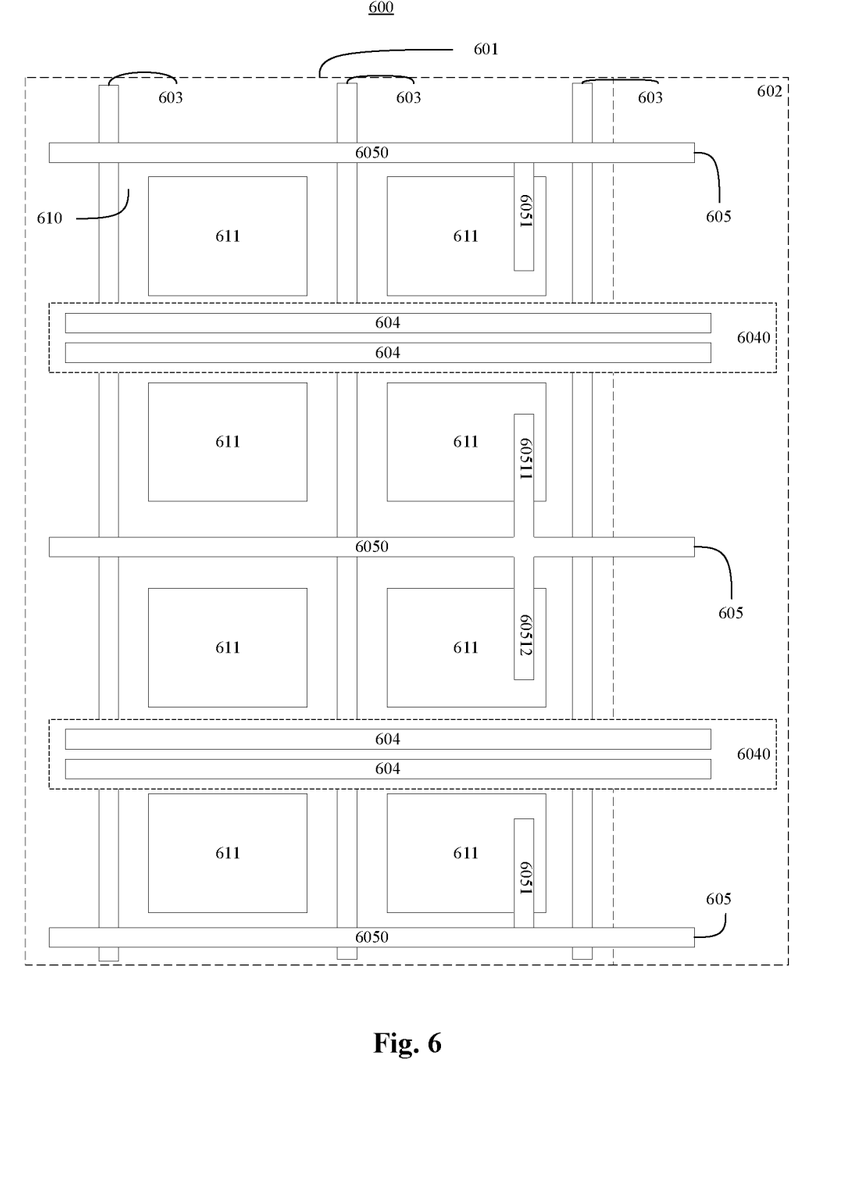
FIG. 6 is still yet another schematic view showing the arrangement of the lines on the array substrate according to one embodiment of the present disclosure.

The present disclosure provides in some embodiments an array substrate, which includes a display region and a non-display region surrounding the display region. The array substrate further includes a plurality of gate lines, a plurality of data lines, and a plurality of common electrode lines. The plurality of data lines and the plurality of gate lines define a plurality of pixel units at the display region. As shown in FIGS. 1 and 6, each pixel unit includes a pixel electrode 101. Among the plurality of common electrode lines 102, at least one common electrode line 102 includes a main line 1021 and a branch line 1022 located at at least one side of the main line, and at least a part of the branch lines 1022 are located at an inner side of a periphery of the display region. In order to show positions of the common electrode lines on the array substrate in a better manner, FIG. 1 merely shows parts of members of the array substrate, and the other relevant members and the position relationship thereamong are shown in FIG. 6.

Through the arrangement of the branch line, electric fields may be generated between the branch line as well as the main line and the pixel electrode in different orientations, so as to deflect liquid crystal molecules at the periphery of the display region to some extent, thereby to improve a display angle and enlarge the range of a viewing angle. In addition, the branch line may have a light-shielding function to some extent, so it is able to reduce an area of a black matrix on a color filter substrate.

In a possible embodiment of the present disclosure, the common electrode line at least includes the branch line located at the inner side of the periphery of the display region.

Figure 5:
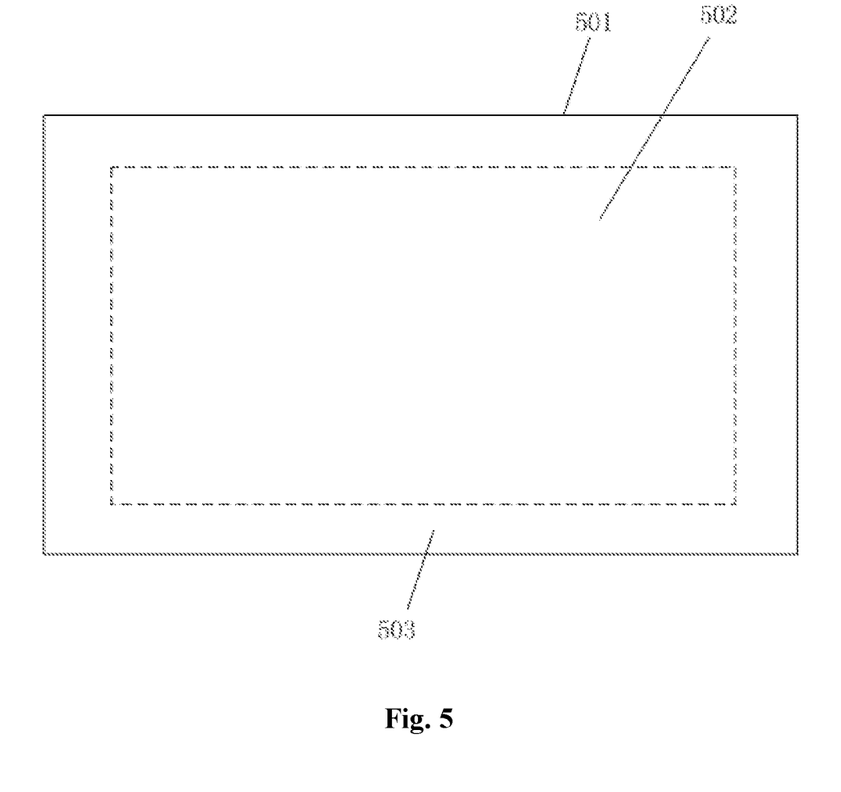
FIG. 5 is a schematic view showing regions of the array substrate according to one embodiment of the present disclosure.

In a possible embodiment of the present disclosure, as shown in FIG. 5, the array substrate 501 includes the display region 502 defined by a dotted box and the non-display region 503 surrounding the display region 502. The inner side of the periphery of the display region refers to an inner edge of the dotted box in FIG. 5, i.e., a side of an edge of the display region 502 away from a corresponding edge of the array substrate 501.

In a possible embodiment of the present disclosure, a portion of the branch line is located at a region where one pixel unit is located, and an orthogonal projection of the branch line onto a plane where the array substrate is located overlaps an orthogonal projection of the pixel electrode of the corresponding pixel unit onto the plane where the array substrate is located. In this way, it is able to further increase a storage capacitance of the array substrate, thereby to deflect the liquid crystal molecules at the periphery of the array substrate and improve a display effect. In addition, the branch line may shield light in a better manner, so as to reduce the area of the black matrix on the color filter substrate.

In a possible embodiment of the present disclosure, a part of the branch lines are located at a region where a plurality of pixel units is located.

In a possible embodiment of the present disclosure, the branch lines are arranged at one side of the main line, or at both the two opposite sides of the main line.

Figure 2:
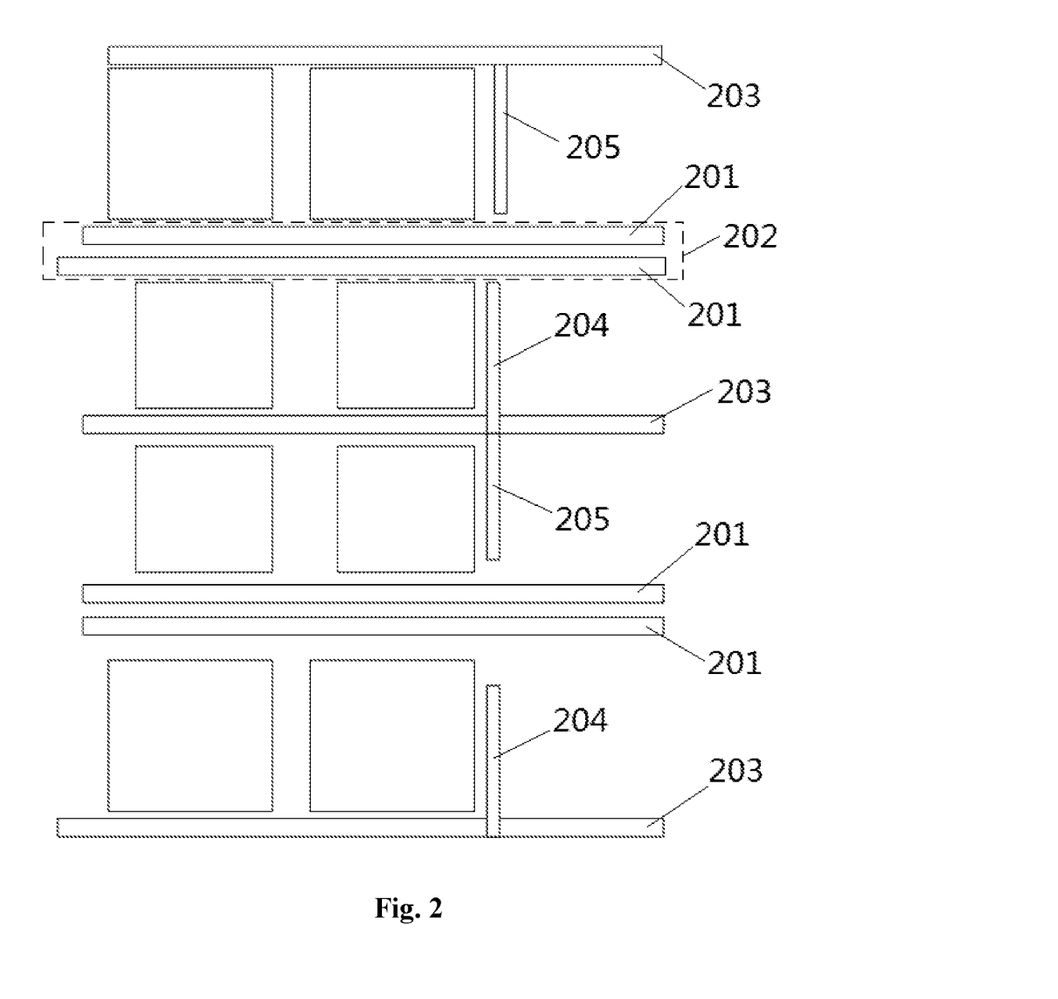
FIG. 2 is another schematic view showing the arrangement of the lines on the array substrate according to one embodiment of the present disclosure.

In a possible embodiment of the present disclosure, as shown in FIGS. 2 and 6, each gate line 201 extends in a row direction, two gate lines 201 corresponding to the pixel units in two adjacent rows form a gate line group 202, each gate line group 202 is arranged between the corresponding pixel units in two adjacent rows, and each common electrode line 203 is arranged between two adjacent rows of the pixel units, i.e., between two adjacent rows of the pixel electrodes 206 in FIG. 2. The gate line groups 202 and the common electrode lines 203 are arranged alternately, and the pixel units in one row are arranged between the gate line group 202 and the common electrode line 203 adjacent to the gate line group 202. The branch line includes a first branch line 204 arranged at one side of the main line and a second branch line 205 arranged at an opposite side of the main line and arranged parallel to, or in a line identical to, the first branch line 204. For example, as shown in FIG. 6, the first branch line 204 and the second branch line 205 are arranged in an identical line.

In a possible embodiment of the present disclosure, the first branch line and the second branch line are arranged parallel to the data line. Each of the first branch line and the second branch line partially overlaps the pixel electrode, i.e., an orthogonal projection of each of the first branch line and the second branch line onto the plane where the array substrate is located overlaps an orthogonal projection of the pixel electrode of the corresponding pixel unit onto the plane where the array substrate is located.

In a possible embodiment of the present disclosure, each branch line may be of various shapes such as an elongated or curved shape.

In a possible embodiment of the present disclosure, each main line is arranged parallel to, and created from a layer identical to, the gate line.

In a possible embodiment of the present disclosure, each branch line is arranged parallel to the data line.

In a possible embodiment of the present disclosure, each main line is of a strip-like shape, and formed integrally with the branch line.

In a possible embodiment of the present disclosure, a length of each branch line is ⅗ to ⅝ of a length of the corresponding pixel unit in an extension direction of the data line. In this way, the branch line may function as to shield the light as possible. To be specific, the length of the pixel unit refers to a length of the pixel unit in the extension direction of the data line.

In a possible embodiment of the present disclosure, a portion of the branch line is located between a first pixel unit and a second pixel unit adjacent to the first pixel unit, and an orthogonal projection of the branch line onto the plane where the array substrate is located overlaps an orthogonal projection of a pixel electrode of the first pixel unit and an orthogonal projection of a pixel electrode of the second pixel unit onto the plane where the array substrate is located.

Figure 4:
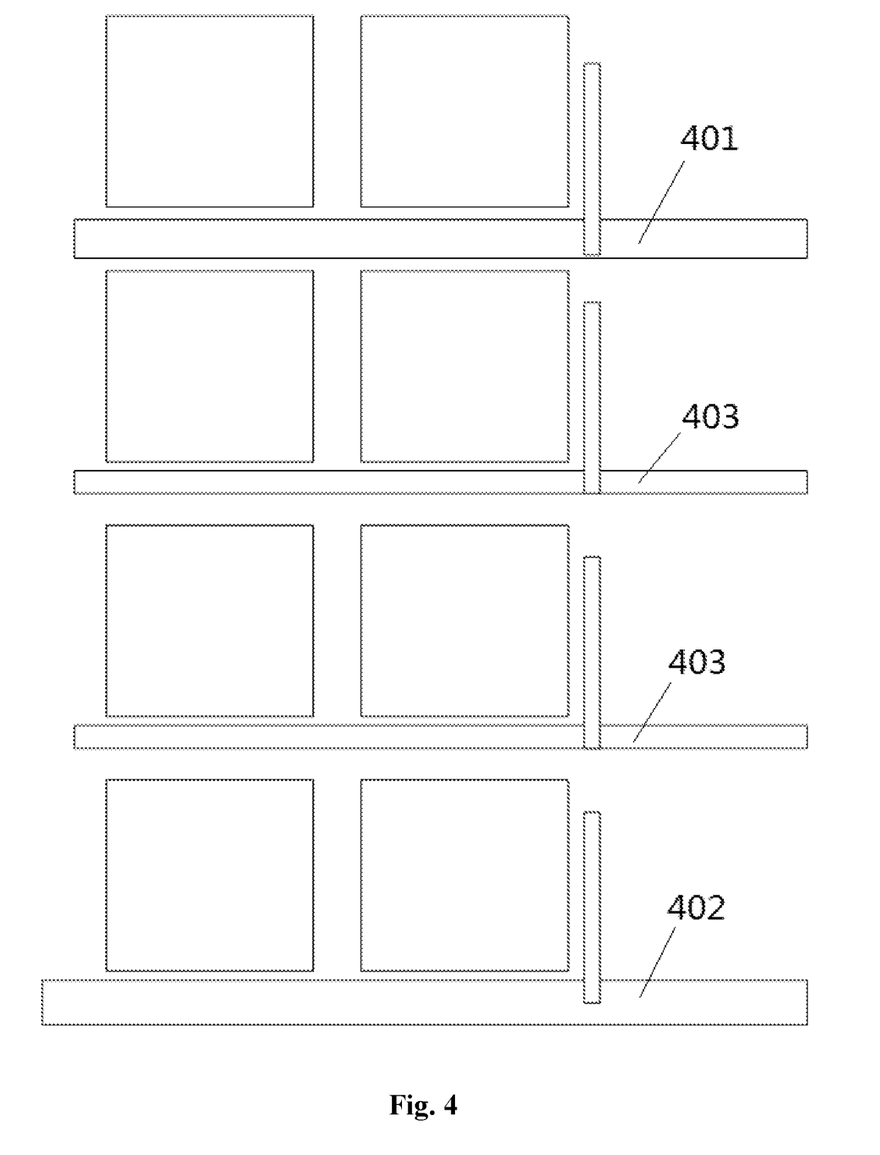
FIG. 4 is still yet another schematic view showing the arrangement of the lines on the array substrate according to one embodiment of the present disclosure.

In a possible embodiment of the present disclosure, referring to FIG. 4, the plurality of common electrode lines includes a first common electrode line 402 and a second common electrode line 401 arranged opposite to the first common electrode line 402, a width of each of the first common electrode line 402 and the second common electrode line 401 is greater than a width of each of the other common electrode lines 403, and the first common electrode line 402 is located at a side of the display region adjacent to a region where a source driving chip is located. In a possible embodiment of the present disclosure, the source driving chip is located below the first common electrode line 402 in FIG. 4. In this way, it is able to increase a signal inputted to the common electrode line at a pixel region, reduce the occurrence of signal delay for the common electrode line, and improve a deflection degree of the liquid crystal molecules at a periphery of the pixel region.

Figure 3:
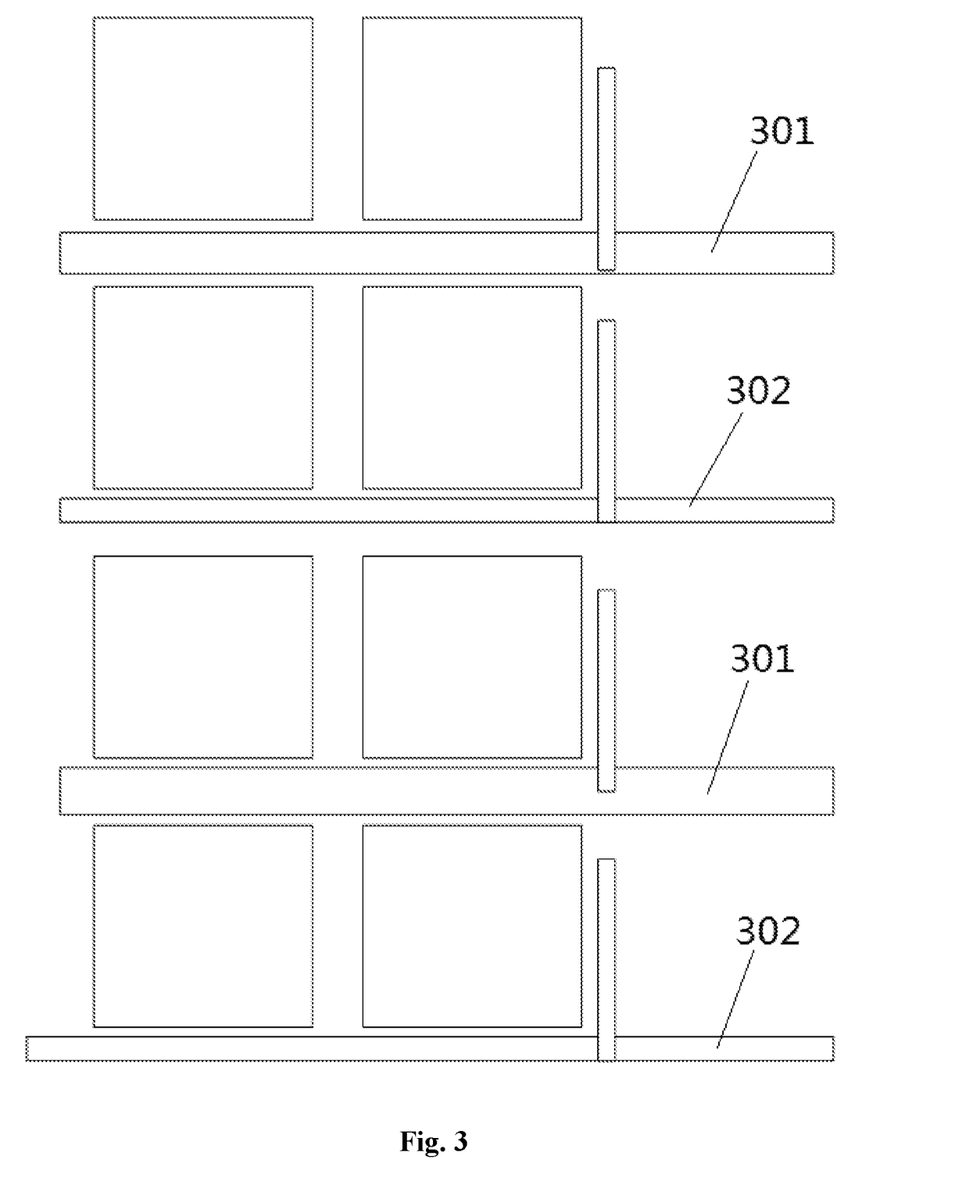
FIG. 3 is yet another schematic view showing the arrangement of the lines on the array substrate according to one embodiment of the present disclosure.

In a possible embodiment of the present disclosure, as shown in FIG. 3, the common electrode lines include a plurality of first common electrode lines 301 and a plurality of second common electrode lines 302. A width of each first common electrode line 301 is greater than a width of each second common electrode line 302, and the first common electrode lines 301 and the second common electrode lines 302 are arranged alternately. In this way, it is able to reduce a difference between the signals from the common electrode lines.

In a possible embodiment of the present disclosure, at least parts of the common electrode lines are electrically connected to each other at the display region. For example, two adjacent common electrode lines are electrically connected to each other at the display region, so as to reduce the difference between the signals from the common electrode lines. Here, the electrical connection may use any connection mode known in the art, which will not be particularly defined herein.

In a possible embodiment of the present disclosure, the common electrode lines are arranged symmetrically relative to a central axis of the array substrate.

In a possible embodiment of the present disclosure, the array substrate further includes a gate insulation layer, which may be of a single-layered structure or a multi-layered structure. For example, the gate insulation layer may include a silicon nitride layer or a silicon oxide layer.

In a possible embodiment of the present disclosure, the gate lines and the data lines of the array substrate may each be made of Cu, Al, Mo, Ti, Cr or W, or an alloy thereof. Each gate line may be of a single-layered structure, or a multi-layered structure such as Mo/Al/Mo, Ti/Cu/Ti or Mo/Ti/Cu.

In a possible embodiment of the present disclosure, the array substrate further includes an active layer and a passivation layer. The active layer may be made of amorphous silicon or an oxide semiconductor. The passivation layer may be made of an inorganic material such as silicon nitride, or an organic material such as resin. The pixel electrode may be made of indium tin oxide (ITO), indium zinc oxide (IZO) or any other transparent metal oxide conductor material.

In a possible embodiment of the present disclosure, the array substrate may be manufactured through the following steps. A metal layer made of Al may be deposited through sputtering, a photoresist may be applied onto the metal layer and exposed and developed, and then the metal layer may be etched, so as to form patterns of the gate lines, gate electrodes and the common electrode lines. The gate insulation layer made of silicon nitride may be deposited through Plasma Enhanced Chemical Vapor Deposition (PECVD), and a semiconductor layer may be deposited onto the gate insulation layer, e.g., amorphous silicon (a-Si)) may be deposited onto the gate insulation layer through PECVD or an indium gallium zinc oxide (IGZO) layer may be deposited onto the gate insulation layer through sputtering. Next, a photoresist may be applied, and then exposed and developed. Then, the semiconductor layer may be etched, so as to form a pattern of the active layer. A metal layer made of Al may be deposited through sputtering, and a photoresist may be applied to the metal layer and then exposed and developed. Next, the metal layer may be etched, so as to form patterns of the data lines, source electrodes and drain electrodes.

The manufacture of the array substrate may further include steps of forming the passivation layer and the pixel electrode.

The present disclosure further provides in some embodiments a display panel including the above-mentioned array substrate, a color filter substrate and a driving circuit such as a source driving chip.

The present disclosure further provides in some embodiments a display device including the above-mentioned display panel, a power supply circuit and an input device such as a button.

As shown in FIG. 6, the present disclosure further provides in some embodiments an array substrate 600 which includes a display region 601 and a non-display region 602 surrounding the display region. The array substrate further includes a plurality of data lines 603 extending in a column direction, a plurality of gate lines 604 extending in a row direction, and a plurality of common electrode lines 605. The plurality of data lines and the plurality of gate lines define a plurality of pixel units 610 at the display region, and each pixel unit includes a pixel electrode 611. At least one of the plurality of common electrode lines includes a main line 6050 extending in the row direction and branch lines 6051, 605211, 60512 extending in the column direction and located at at least one side of the main line and at an inner side of a periphery of the display region. A portion of the branch line is located at a region where at least one pixel unit is located, and an orthogonal projection of the branch line onto a plane where the array substrate is located overlaps an orthogonal projection of the pixel electrode of the corresponding pixel unit onto the plane where the array substrate is located. Two gate lines corresponding to the pixel units in two adjacent rows form a gate line group 6040, each gate line group is arranged between the corresponding pixel units in two adjacent rows, each common electrode line is arranged between two adjacent rows of the pixel units, the gate line groups and the common electrode lines are arranged alternately, and the pixel units in one row are arranged between the gate line group and the common electrode line adjacent to the gate line group. The main line and the branch line of each common electrode line are created from a layer identical to the gate line.

According to array substrate, the display panel and the display device in the embodiments of the present disclosure, at least one of the common electrode lines is provided with the branch line, and at least a part of the branch lines are located at a periphery of the display region. As a result, it is able to increase a storage capacitance of the array substrate, so as to deflect liquid crystal molecules at the inner side of the periphery of the display region, thereby to enlarge a display angle. In addition, the branch line may function as to shield the light to some extent, so it is able to reduce the area of the black matrix on the color filter substrate.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a display region and a non-display region surrounding the display region, wherein the array substrate further comprises a plurality of gate lines, a plurality of data lines, and a plurality of common electrode lines;
   the plurality of data lines and the plurality of gate lines define a plurality of pixel units at the display region;
   each pixel unit comprises a pixel electrode;
   at least one of the plurality of common electrode lines comprises a main line and a branch line located at at least one side of the main line; and
   at least a part of the branch lines are located at an inner side of a periphery of the display region,
   wherein the branch line is arranged at two opposite sides of the main line.

2. The array substrate according to claim 1, wherein a portion of the branch line is located at a region where one pixel unit is located, and an orthogonal projection of the branch line onto a plane where the array substrate is located overlaps an orthogonal projection of the pixel electrode of the corresponding pixel unit onto the plane where the array substrate is located.

3. The array substrate according to claim 2, wherein a part of the branch lines are located at a region where a plurality of pixel units are located.

4. The array substrate according to claim 1, wherein each gate line extends in a row direction, two gate lines corresponding to the pixel units in two adjacent rows form a gate line group, each gate line group is arranged between the corresponding pixel units in two adjacent rows, each common electrode line is arranged between two adjacent rows of the pixel units, the gate line groups and the common electrode lines are arranged alternately, and the pixel units in one row are arranged between the gate line group and the common electrode line adjacent to the gate line group; and
   the branch line comprises a first branch line arranged at one side of the main line and a second branch line arranged at an opposite side of the main line and arranged parallel to, or in a line identical to, the first branch line.

5. The array substrate according to claim 1, wherein the main line is arranged parallel to, and created from a layer identical to, the gate line.

6. The array substrate according to claim 1, wherein the branch line is arranged parallel to the data line.

7. The array substrate according to claim 6, wherein a length of the branch line is ⅗ to ⅚ of a length of the corresponding pixel unit in an extension direction of the data line.

8. The array substrate according to claim 1, wherein a portion of the branch line is located between a first pixel unit and a second pixel unit adjacent to the first pixel unit, and an orthogonal projection of the branch line onto a plane where the array substrate is located overlaps an orthogonal projection of a pixel electrode of the first pixel unit and an orthogonal projection of a pixel electrode of the second pixel unit onto the plane where the array substrate is located.

9. The array substrate according to claim 1, wherein the plurality of common electrode lines comprises a first common electrode line and a second common electrode line arranged opposite to the first common electrode line on the array substrate, a width of each of the first common electrode line and the second common electrode line is greater than a width of each of the other common electrode lines.

10. The array substrate according to claim 1, wherein the common electrode lines comprises a plurality of first common electrode lines and a plurality of second common electrode lines, a width of the first common electrode line is greater than a width of the second common electrode line, and the first common electrode line and the second common electrode line are arranged alternately.

11. The array substrate according to claim 8, wherein the common electrode lines are arranged symmetrically relative to a central axis of the array substrate.

12. The array substrate according to claim 8, wherein at least parts of the common electrode lines are electrically connected to each other at the display region.

13. The array substrate according to claim 8, wherein two adjacent common electrode lines are electrically connected to each other at the display region.

14. A display panel, comprising the array substrate according to claim 1.

15. A display device, comprising the display panel according to claim 14.

16. The array substrate according to claim 2, wherein a portion of the branch line is located between a first pixel unit and a second pixel unit adjacent to the first pixel unit, and an orthogonal projection of the branch line onto the plane where the array substrate is located overlaps an orthogonal projection of a pixel electrode of the first pixel unit and an orthogonal projection of a pixel electrode of the second pixel unit onto the plane where the array substrate is located.

17. The array substrate according to claim 2, wherein the plurality of common electrode lines comprises a first common electrode line and a second common electrode line arranged opposite to the first common electrode line on the array substrate, a width of each of the first common electrode line and the second common electrode line is greater than a width of each of the other common electrode lines.

18. The array substrate according to claim 3, wherein a portion of the branch line is located between a first pixel unit and a second pixel unit adjacent to the first pixel unit, and an orthogonal projection of the branch line onto a plane where the array substrate is located overlaps an orthogonal projection of a pixel electrode of the first pixel unit and an orthogonal projection of a pixel electrode of the second pixel unit onto the plane where the array substrate is located.

19. An array substrate, comprising a display region and a non-display region surrounding the display region, wherein the array substrate further comprises a plurality of gate lines, a plurality of data lines, and a plurality of common electrode lines;
the plurality of data lines and the plurality of gate lines define a plurality of pixel units at the display region;
each pixel unit comprises a pixel electrode;
at least one of the plurality of common electrode lines comprises a main line and a branch line located at at least one side of the main line; and
at least a part of the branch lines are located at an inner side of a periphery of the display region,
wherein the plurality of common electrode lines comprises a first common electrode line and a second common electrode line arranged opposite to the first common electrode line on the array substrate, a width of each of the first common electrode line and the second common electrode line is greater than a width of each of the other common electrode lines.

20. An array substrate, comprising a display region and a non-display region surrounding the display region, wherein the array substrate further comprises a plurality of gate lines, a plurality of data lines, and a plurality of common electrode lines;
the plurality of data lines and the plurality of gate lines define a plurality of pixel units at the display region;
each pixel unit comprises a pixel electrode;
at least one of the plurality of common electrode lines comprises a main line and a branch line located at at least one side of the main line; and
at least a part of the branch lines are located at an inner side of a periphery of the display region,
wherein the common electrode lines comprises a plurality of first common electrode lines and a plurality of second common electrode lines, a width of the first common electrode line is greater than a width of the second common electrode line, and the first common electrode line and the second common electrode line are arranged alternately.

* * * * *